(12) United States Patent
Oh

(10) Patent No.: US 6,422,489 B2
(45) Date of Patent: Jul. 23, 2002

(54) LOCKING APPARATUS FOR A NOZZLE EXCHANGE APPARATUS

(75) Inventor: Tae Seok Oh, Seoul (KR)

(73) Assignee: Mirae Corporation, Choongchungnam-do (KR)

( * ) Notice: Subject to any disclaimer, the term of this patent is extended or adjusted under 35 U.S.C. 154(b) by 0 days.

(21) Appl. No.: 09/955,947

(22) Filed: Sep. 20, 2001

Related U.S. Application Data

(63) Continuation-in-part of application No. 09/480,633, filed on Jan. 10, 2000, now abandoned.

(30) Foreign Application Priority Data

Feb. 8, 1999 (KR) .............................................. 99-1860

(51) Int. Cl.$^7$ ................................................. B05B 1/00
(52) U.S. Cl. ...................... 239/600; 239/548; 239/566; 239/580
(58) Field of Search ................................ 239/600, 548, 239/566, 580

(56) References Cited

U.S. PATENT DOCUMENTS 3,610,535 A * 10/1971 Bradshaw ................... 239/305
5,201,696 A     4/1993 Kinback et al.
5,472,669 A * 12/1995 Miki et al. ................... 422/100
5,566,446 A * 10/1996 Luckhardt et al. .......... 227/120
5,679,158 A * 10/1997 Holzer et al. ................ 118/407

* cited by examiner

Primary Examiner—Robin O. Evans
(74) Attorney, Agent, or Firm—Fleshner & Kim, LLP

(57) ABSTRACT

A nozzle exchanging or mounting apparatus is provided for use in exchanging nozzles utilized for vacuum sucking a semiconductor device and various electric components in a surface mounting apparatus. The nozzle exchanging or mounting apparatus includes a nozzle installation body having a nozzle installation portion in which a plurality of nozzles can be disposed at a predetermined interval therebetween, a locking unit, the locking unit being longitudinally inserted into and installed at one side of the nozzle installation body, a bracket for inserting one side of the locking unit thereinto to fix the locking unit in place, and a driving unit for selectively moving the locking unit backward and forward. The apparatus provides the advantage that the time taken to exchange nozzle(s) can be reduced due to the stable and prompt exchange of the nozzle(s).

17 Claims, 4 Drawing Sheets

LOCKING APPARATUS FOR A NOZZLE EXCHANGE APPARATUS

This application is a continuation in part of application Ser. No. 09/480,633 filed Jan. 10, 2000, now abandoned.

BACKGROUND OF THE INVENTION

1. Field of the Invention

The invention relates to a nozzle exchanging or mounting apparatus. More particularly, the invention relates to a locking apparatus for a nozzle exchanging or mounting apparatus by means of which a nozzle(s) can be easily and promptly exchanged with another nozzle(s) corresponding to a size of a semiconductor device.

2. Background of the Related Art

In the recent development of electric and electronic components for electronic products, there has been a trend toward higher density, smaller size, and various types of components, due to the high level of competition. In particular, a surface mounting technology discussed hereinafter is used to mount various electric and electronic components to a printed circuit board using a surface mounting apparatus. The use of such technology is becoming popular.

The surface mounting assembly equipment typically has, as the core apparatus, the surface mounting apparatus for mounting various types of components onto the printed circuit board. The surface mounting apparatus receives the various types of components from a parts feeder, transfers the components to component mounting positions, and then performs the mounting of the components onto the printed circuit board.

Surface mounting apparatuses are generally classified into two types of apparatuses, i.e., high speed apparatuses and general purpose apparatuses, depending upon the function thereof. The former is designed to assemble a large number of components in a relatively short time period, thus advantageously resulting in a faster component mounting operation suitable for mass production. However, this type of apparatus has a drawback in the reduced mounting precision.

The latter is adapted to mount various types of components, thus resulting in higher mounting precision and the ability to mount various types of components. The general purpose apparatus has the advantage of a smaller amount of production for various types of components, but the drawback is its lower throughput caused by the reduced production.

A surface mounting apparatus consists of a feeder (hereinafter, referred to as 'tape feeder') for supplying components, an X-Y gantry for determining operating positions, a conveyer for carrying a printed circuit board, and a header unit for picking up the components from the tape feeder in an orderly fashion and mounting the same onto the printed circuit board. The term "surface mounting apparatus" generally refers to an apparatus adapted to mount electronic components, including various chips, onto a printed circuit board, and is also called a "mounter".

The structure of the above mentioned surface mounting apparatus will be described in detail as follows.

The surface mounting apparatus discussed above consists of a base assembly; a conveyor provided on an upper part of the base assembly for transferring the printed circuit board; a feeder portion for supplying various chips or surface mounting components to be mounted onto the printed circuit board transferred by the conveyor; a mounter head assembly for mounting each of the various chips or surface mounting components which are supplied by the feeder portion onto the printed circuit board; a vision or sensor portion for recognizing the components and correcting the mounting positions so that the various chips or surface mounting components are accurately mounted onto the printed circuit board; and an X-Y gantry, such as a table, equipped with the vision or sensor portion and the mounter head assembly for positioning the same.

Further, the mounter head assembly includes a suction nozzle for directly vacuum sucking a part, a nozzle chuck for holding the sucked part, and a nozzle exchanging apparatus for exchanging one nozzle with another nozzle. The nozzle exchanging apparatus is used to exchange a first nozzle designed to hold a first type of electronic component with a second nozzle designed to hold a second type of electronic component. Since the kinds of semiconductor devices to be mounted onto the printed circuit board may have different sizes, an easy and prompt operation is required to exchange one nozzle with another nozzle.

However, such needs cannot be satisfied due to the lack of adequate nozzle locking apparatus. Further, an accurate and stable exchanging operation of the nozzle has been impossible thusfar. Moreover, although prior art nozzle locking apparatuses have been provided, the prior art devices take too long to exchange a nozzle.

SUMMARY OF THE INVENTION

An object of the invention is to solve at least the above problems and/or disadvantages and to provide at least the advantages described hereinafter.

Accordingly, it is an object of the invention to provide a locking apparatus for a nozzle exchanging apparatus by means of which a nozzle can be easily and promptly exchanged by releasing the nozzle. A device embodying the invention allows a new nozzle to be rapidly locked into place when a first nozzle needs to be exchanged with a second nozzle.

It is another object of the invention to provide a locking apparatus for the nozzle exchanging apparatus by means of which the precision of the mounting operation can be further improved by stable placing of the nozzle.

The above mentioned objects can be accomplished by a locking apparatus for a nozzle exchanging apparatus according to an embodiment of the invention. The locking apparatus includes a nozzle installation body having a nozzle installation portion in which a plurality of nozzles are disposed at a predetermined interval therebetween. The device also includes locking means, the locking means being longitudinally inserted into and installed at one side of the nozzle installation body, and the device further includes driving means coupled to a bracket fixed at one side of the locking means, for selectively moving the locking means backward and forward in a longitudinal direction.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

The structure of a nozzle exchanging apparatus according to an embodiment of the invention will be described with reference to the accompanying drawings.

Figure 1A:
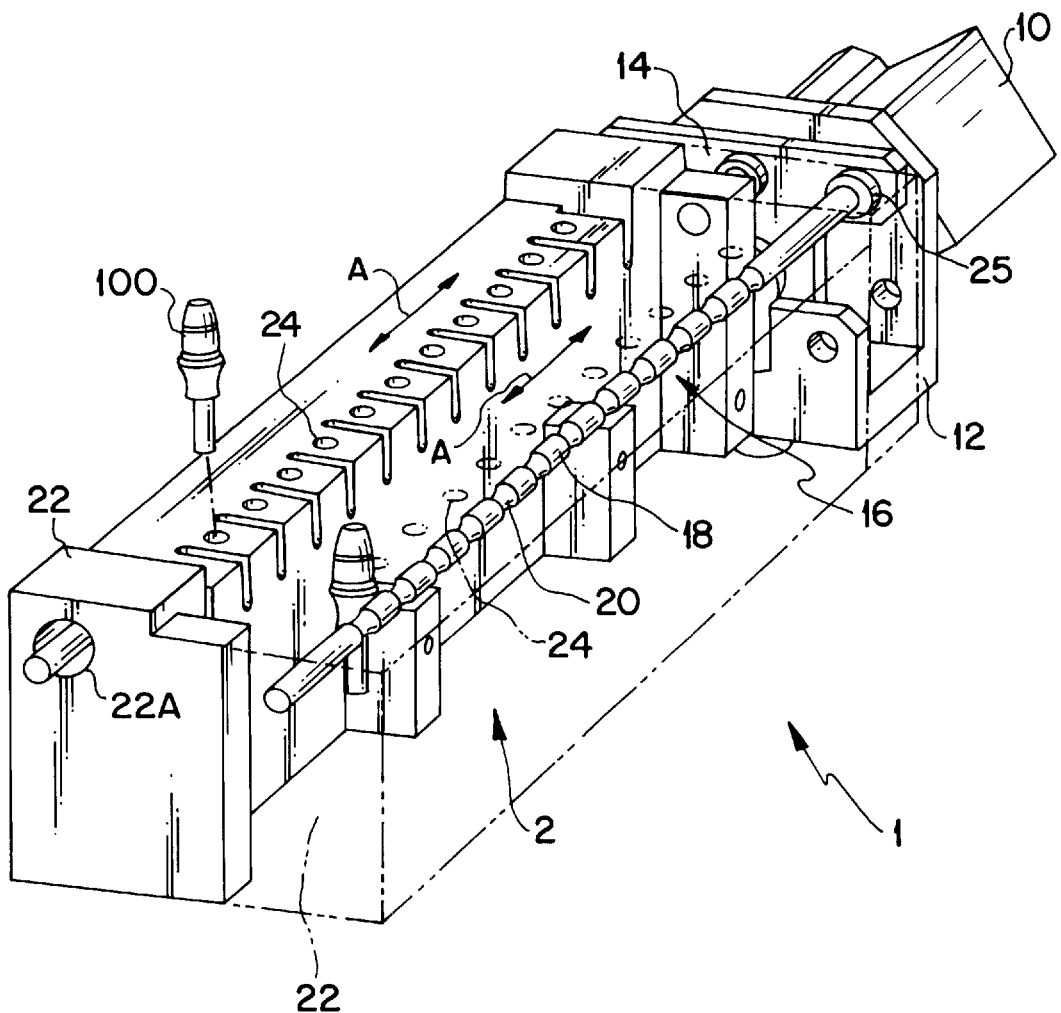
FIG. 1A is a partial perspective view of a nozzle exchanging apparatus according to an embodiment of the invention in a state wherein the nozzle exchanging apparatus is being assembled, with one nozzle introduced into the apparatus and one nozzle shown being introduced into the apparatus.
Figure 1B:
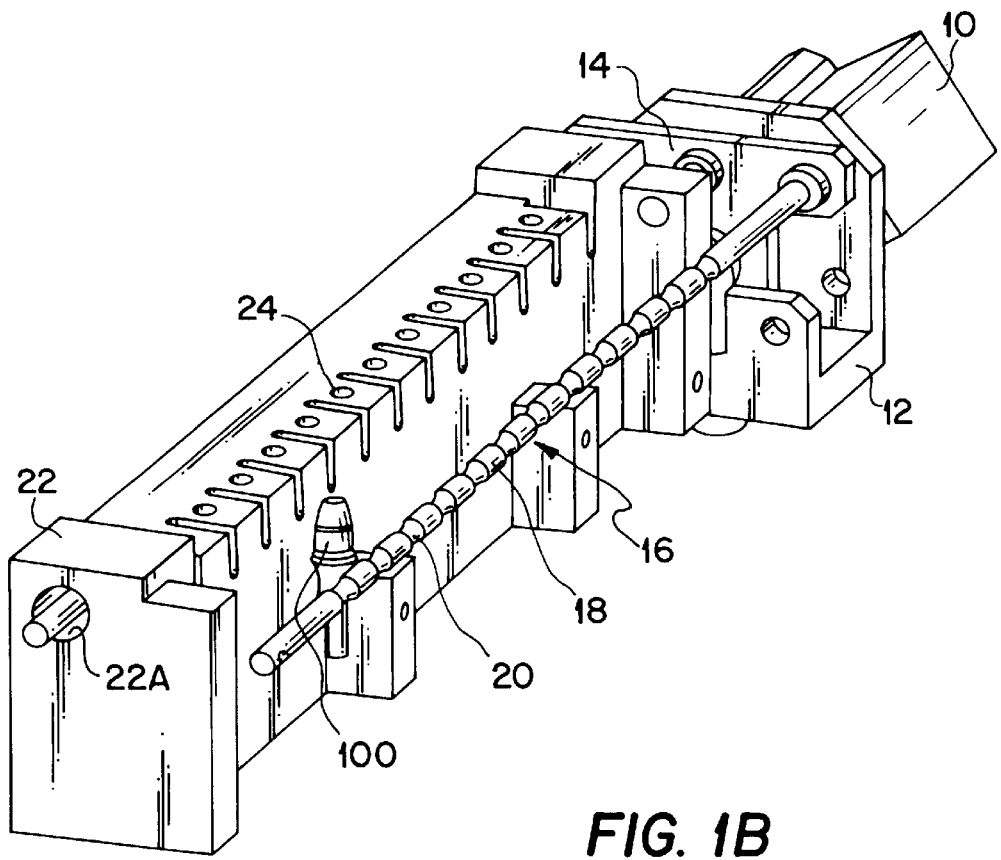
FIG. 1B is a partial cut-away perspective view of the nozzle exchanging apparatus according to FIG. 1A.
Figure 2:
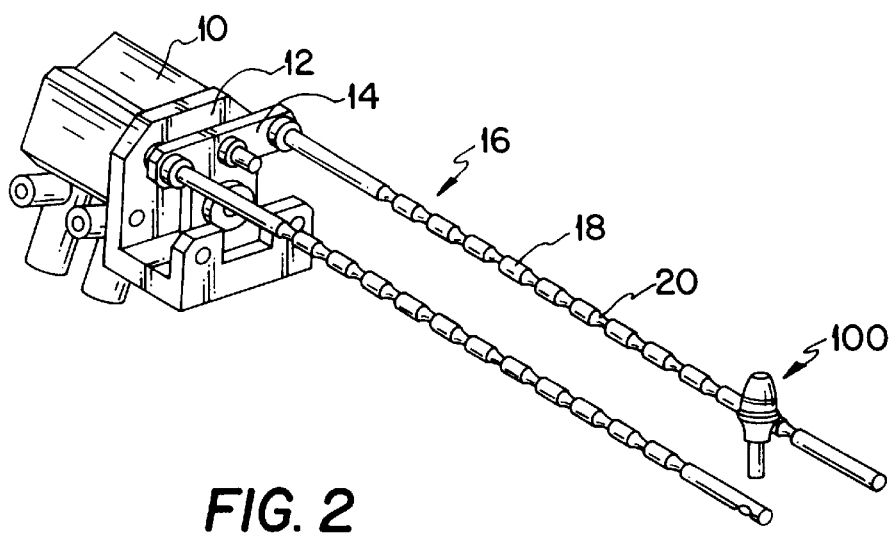
FIG. 2 is a perspective view showing a locking part of the nozzle exchanging apparatus of FIGS. 1A–1B with one exemplary nozzle positioned adjacent the locking part.

FIG. 1A is a partial perspective view of a nozzle exchanging apparatus according to an embodiment of the invention in a state wherein the nozzle exchanging apparatus is being assembled with one nozzle introduced into the apparatus and one nozzle being introduced into the apparatus. FIG. 1B is a partial cut-away perspective view of the nozzle exchanging apparatus according to FIG. 1A. FIG. 2 is a perspective view showing a locking part of the nozzle exchanging apparatus of FIGS. 1A–1B, with one exemplary nozzle positioned adjacent the locking part.

The nozzle exchanging apparatus according to an embodiment of the invention includes a locking apparatus 1, which comprises a nozzle installation body 22, a locking part 16, a bracket 12, and driving means 10. The nozzle installation body 22 includes a cavity 22A configured to receive therein the locking part 16.

It should be understood that half of the installation body 22 has been removed in FIGS. 1A and 1B so that all portions of the device can be clearly shown. When fully assembled, the device would include two installation body portions 22 so that two rows of nozzles could be held in the device.

The driving means 10 is configured to drive or move the locking part 16 in a direction along a longitudinal axis of the locking part 16 (the direction of arrow A in FIG. 3A), within the cavity 22A. The driving means 10 may be any sort of driving means, including a cylinder type driving means, such as a fluid actuated cylinder or an air cylinder. Other types of driving means, such as electronic motors, linear motors, solenoids and other devices may also be appropriate. A support plate 14 mounted on bracket 12 supports one end of the locking part 16 disposed adjacent the driving means 10.

Each nozzle installation body 22 (only one being shown in FIGS. 1A and 1B) has a plurality of nozzle installation portions 24 in which nozzles 100 are installed with a predetermined interval therebetween. For simplification purposes, FIG. 1A shows only two nozzles 100, the one on the left being installed into a nozzle installation portion 24, and the one on the right being shown in the position it would occupy after being installed into the rightmost nozzle installation body 22 (not shown). However, it should be understood that a nozzle 100 can be introduced into and removed from each nozzle installation portion 24.

As previously discussed, the locking part 16 is longitudinally inserted into and through the cavities 22A in each of the nozzle installation bodies 22. One end of the locking part 16 is fixed into the bracket 12 via the support plate 14, and is attached thereto by some type of attachment means 25, such as a nut for example. The driving means 10 is used to selectively move the locking part 16 back and forth along a longitudinal axis of the locking part 16 (the direction of arrow A of FIG. 3A).

The locking part 16, which is selectively moved back and forth longitudinally by the driving means 10, has protrusions 18 and depressions 20 alternatively disposed along a length of the locking part 16, as shown in FIGS. 1A, 1B, and 2. The driving means 10 may be generally in the form of a cylinder, as shown in the figures of this application. However, other shapes and configurations may also be appropriate.

Figure 3A:
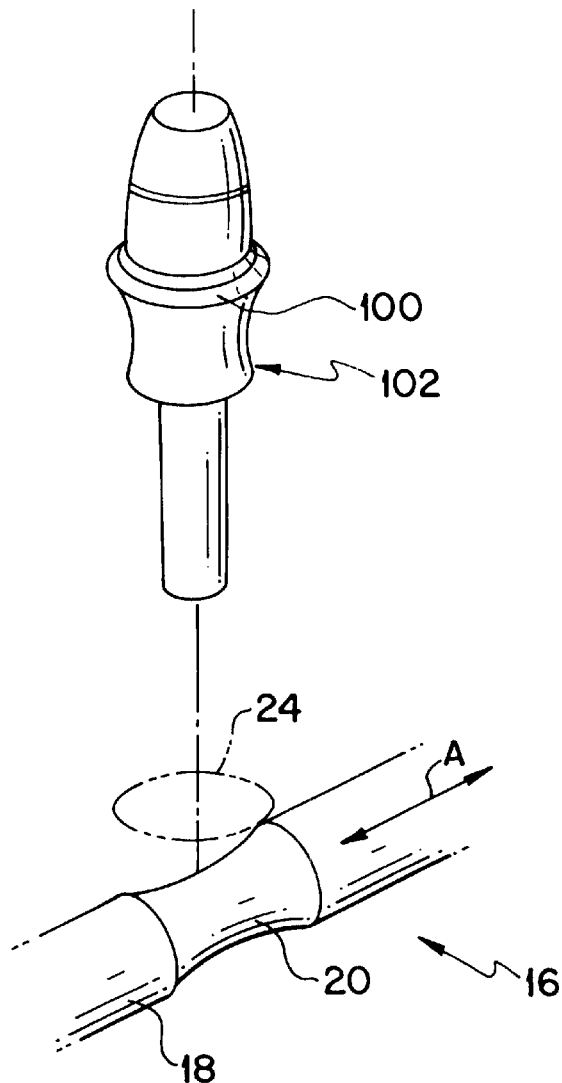
FIG. 3A is schematic diagram showing a nozzle being introduced into the nozzle installation body (not shown) via the nozzle installation portion of the nozzle exchanging apparatus of FIG. 1 while the locking part is in the unlocked position.
Figure 3B:
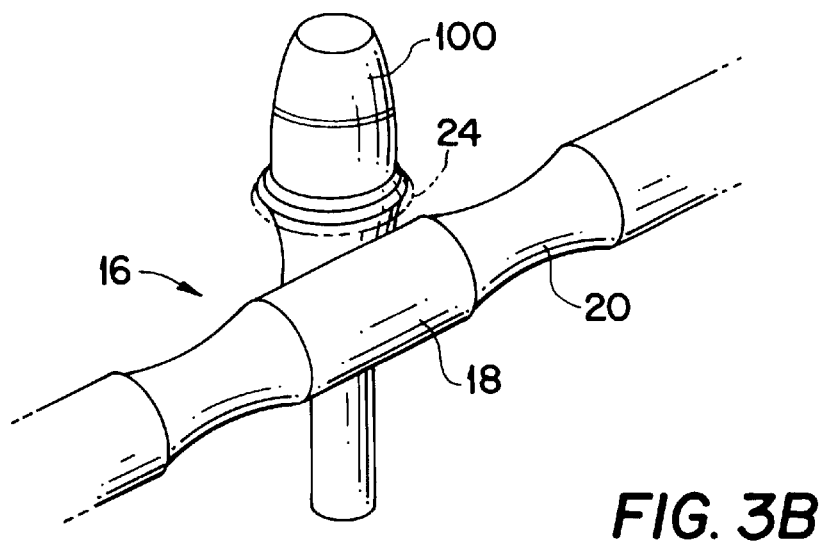
FIG. 3B is a schematic diagram showing a nozzle in the nozzle installation portion with the locking part of the locking apparatus in the locked position.

The protrusions 18 and depressions 20 of the locking part 16 serve to lock or unlock a nozzle 100 with respect to the nozzle installation body 22, corresponding to their position with respect to the nozzle installation portion 24, as shown in FIGS. 3A–3B. As shown in FIG. 3A, when a depression 20 is aligned with a nozzle installation portion 24, a nozzle 100 can be inserted into (or removed from) the nozzle installation portion 24 and the nozzle installation body 22. As shown in FIG. 3B, when a protrusion 18 is moved into alignment with a nozzle installation portion 24, a nozzle 100 disposed within the nozzle installation portion 24 and nozzle installation body 22 is locked into place.

Now, an operation of the locking apparatus 2 of the nozzle exchanging apparatus 1 according to an embodiment of the invention will be described in detail below.

The locking part 16, as discussed above, and shown in FIGS. 1A–3B as an elongated rod, has a surface on which a plurality of protrusions 18 and depressions 20 are alternatively formed. When the depressions 20 are aligned with nozzle installation portions 24, as shown in FIGS. 3A and 4B, one or more of a plurality of nozzles 100 may be inserted into the nozzle installation body 22, or may be removed if already disposed therein, to be exchanged with nozzles for picking up components of another size. The driving means 10 causes the locking part 16 to be selectively moved forward or backward within the nozzle installation body 22.

Figure 4A:
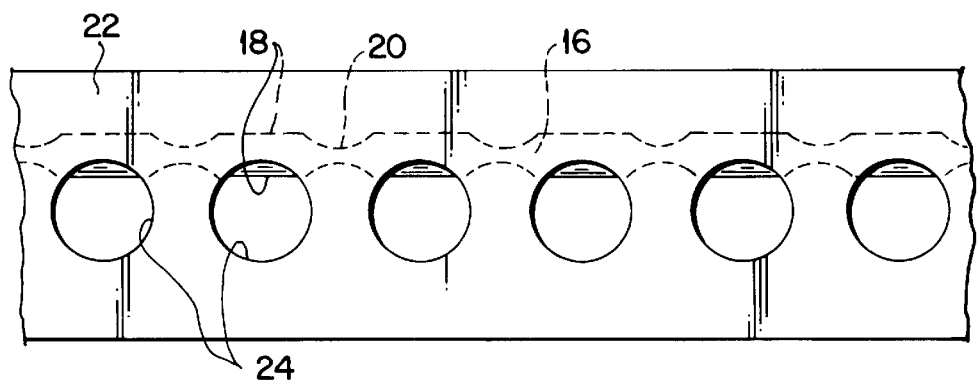
FIG. 4A shows a portion of an apparatus embodying the invention in the locked position.
Figure 4B:
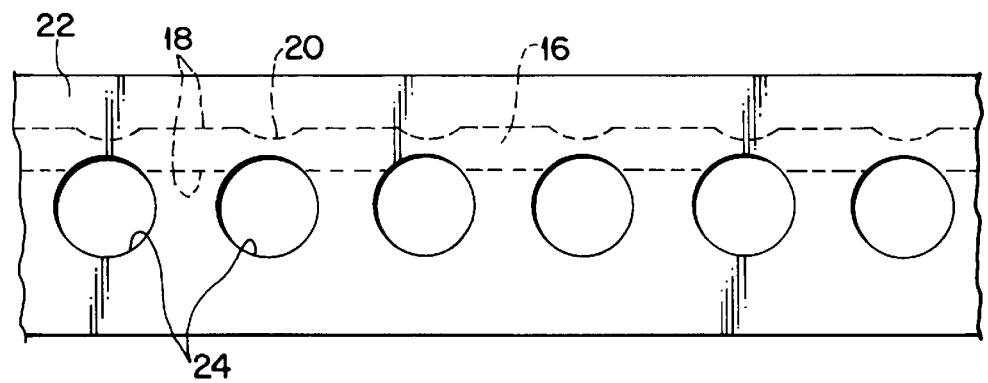
FIG. 4B shows a portion of an apparatus embodying the invention in the unlocked position.

When the locking part 16 is moved by driving means 10 such that the protrusions 18 are aligned with the nozzle installation portions 24, as shown in FIGS. 3B and 4A, the nozzles are locked into the nozzle installation body 22. The protrusions 18 protrude into corresponding depressions 102 on the sides of the nozzles 100 to prevent the nozzles from being removed from the nozzle installation body 22.

The invention, therefore, allows a nozzle 100 to be separated from the nozzle installation portion 24, and exchanged with another nozzle. Further, since the locking part 16 according to this embodiment has a circular cross section, alignment of the nozzles is not required in exchanging the nozzles.

As described above, the locking apparatus of the nozzle exchanging apparatus according to an embodiment of the invention provides an easy means of exchanging nozzles, and thereby reduces the time required for performing an exchanging operation.

The invention further has the advantage that nozzles can be stably maintained and easily exchanged reducing an exchange operation time period, allowing the mounting time for the mounter to be reduced, and thereby improving an operation efficiency.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A locking apparatus for a nozzle exchanging apparatus, comprising:
   a nozzle mounting body having a nozzle mounting portion configured such that a plurality of nozzles can be mounted therein at a predetermined interval therebetween;
   a locking device longitudinally inserted into the nozzle mounting body and configured to lock one or more of the plurality nozzles into the nozzle mounting body; and
   a driver for selectively moving the locking device in a direction of a longitudinal axis of the locking device.

2. The locking apparatus as defined in claim 1, further comprising a bracket for inserting one side of the locking device thereinto to fix the locking device with respect to the nozzle mounting body.

3. The locking apparatus as defined in claim 1, wherein the driver comprises an air cylinder.

4. The locking apparatus as defined in claim 1, wherein the locking device includes a shaft on which protrusions and depressions are alternatively formed.

5. The locking apparatus as defined in claim 4, wherein the shaft of the locking device is configured such that movement of the shaft will cause either the depressions or the protrusions on the shaft to come into alignment with a plurality of apertures in the nozzle mounting body that are configured to receive a corresponding plurality of nozzles.

6. The locking apparatus of claim 5, wherein when the protrusions on the shaft of the locking device are in alignment with the apertures in the nozzle mounting body, the protrusions act to lock one or more of the plurality of nozzles to the nozzle mounting body.

7. The locking apparatus of claim 6, wherein when the depressions on the shaft of the locking device are in alignment with the apertures in the nozzle mounting body, the depressions allow nozzles to be inserted into and removed from the nozzle mounting body.

8. A nozzle mounting apparatus, comprising:
   a nozzle mounting body having a plurality of mounting apertures, wherein each mounting aperture is configured to receive a nozzle; and
   a locking assembly for locking one or more nozzles in the mounting apertures, wherein the locking assembly comprises:
      a locking shaft, mounted in the nozzle mounting body adjacent to the plurality of mounting apertures, wherein the locking shaft includes a plurality of depressions and projections; and
      a drive mechanism for moving the locking shaft in a direction along its longitudinal axis, wherein the drive mechanism is configured to move the shaft to a locked position where the plurality of protrusions on the shaft are adjacent the plurality of mounting apertures, and to an unlocked position where the plurality of depressions are located adjacent the plurality of mounting apertures.

9. The nozzle mounting apparatus of claim 8, wherein the drive mechanism comprises a fluid actuated cylinder.

10. The nozzle mounting apparatus of claim 8, wherein the locking shaft is mounted in the nozzle mounting body such that when the locking shaft is in the locked position, each of the plurality of protrusions extend into corresponding ones of the mounting apertures.

11. The nozzle mounting apparatus of claim 10, wherein when the locking shaft is in the unlocked position, each of the depressions on the locking shaft are aligned with corresponding ones of the mounting apertures such that substantially no portion of the locking shaft extends into the mounting apertures.

12. The nozzle mounting apparatus of claim 10, wherein the protrusions on the locking shaft are configured to cooperate with depressions on nozzles mounted in the mounting apertures such that when the locking shaft is in the locked position, the nozzles cannot be removed from the mounting apertures.

13. A nozzle mounting apparatus, comprising:
   a nozzle mounting body having a plurality of mounting apertures, wherein each mounting aperture is configured to receive a nozzle; and
   a locking assembly for locking one or more nozzles in the mounting apertures, wherein the locking assembly comprises:
      a locking shaft, mounted in the nozzle mounting body adjacent to the plurality of mounting apertures, wherein the locking shaft includes a plurality of depressions, and
      a drive mechanism for selectively moving the depressions on the locking shaft into and out of alignment with the plurality of mounting apertures.

14. The nozzle mounting apparatus of claim 13, wherein when the depressions are aligned with the mounting apertures, one or more nozzles can be inserted into and removed from the mounting apertures.

15. The nozzle mounting apparatus of claim 13, wherein when the depressions are not aligned with the mounting apertures, at least a portion of the locking shaft extends into the mounting apertures.

16. The nozzle mounting assembly of claim 15, wherein the locking shaft is configured such that when the depressions are not aligned with the mounting apertures, the portions of the locking shaft extending into the mounting apertures will interact with nozzles in the mounting apertures to lock the nozzles to the nozzle mounting body.

17. The nozzle mounting assembly of claim 16, wherein the locking shaft is configured such that when the depressions are not aligned with the mounting apparatus, portions of the locking shaft protrude into depressions formed in nozzles located in the mounting apertures.

* * * * *